United States Patent [19]

Pace

[11] Patent Number: 4,866,261
[45] Date of Patent: Sep. 12, 1989

[54] DATA LIMITER HAVING CURRENT CONTROLLED RESPONSE TIME

[75] Inventor: Gary L. Pace, Boca Raton, Fla.
[73] Assignee: Motorola, Inc., Schaumburg, Ill.
[21] Appl. No.: 246,905
[22] Filed: Sep. 16, 1988

Related U.S. Application Data

[63] Continuation of Ser. No. 277, Jan. 2, 1987, abandoned.
[51] Int. Cl.[4] .................. H03M 1/84; H03M 1/00
[52] U.S. Cl. .................. 341/138; 328/165; 328/167; 455/334; 455/309; 341/126; 341/155; 341/172
[58] Field of Search .................. 328/162, 165, 167; 375/88; 341/138

[56] References Cited

U.S. PATENT DOCUMENTS

| | | |
|---|---|---|
| 2,493,045 | 1/1950 | Toth . |
| 3,085,131 | 4/1963 | Diehl . |
| 3,102,237 | 8/1963 | Elliot . |
| 3,164,773 | 1/1965 | Daniel . |
| 3,214,700 | 10/1965 | Hook .................. 378/165 |
| 3,550,018 | 12/1970 | James .................. 328/165 |
| 3,555,438 | 1/1971 | Ragsdales . |
| 3,571,620 | 3/1971 | Hansen et al. . |
| 3,737,790 | 6/1973 | Brown .................. 328/165 |
| 4,042,888 | 8/1977 | Rae . |
| 4,114,097 | 9/1978 | Kubo et al. . |
| 4,185,246 | 1/1980 | Schroeder . |
| 4,263,356 | 4/1981 | Astle . |
| 4,271,153 | 6/1981 | Fukuhara et al. . |
| 4,274,132 | 6/1981 | Molyneux-Berry . |
| 4,380,832 | 4/1983 | Nagata et al. . |
| 4,590,394 | 5/1986 | Pace . |

OTHER PUBLICATIONS

National Semiconductor AN-29, "IC OP AMP Beats Fets on Input Current", Dec. 1969.

Primary Examiner—William M. Shoop, Jr.
Assistant Examiner—Helen Kim
Attorney, Agent, or Firm—Vincent B. Ingrassia; Anthony J. Sarli, Jr.

[57] ABSTRACT

A data limiter in a paging receiver for converting an analog signal to a digital signal, the data limiter having a variable time constant. The data limiter includes an amplifying circuit and an integrating circuit. The amplifying circuit, being responsive to the analog input signal generated from a receiving circuit of the paging receiver, generates a reference signal depending upon a variable bias current input to the amplifying circuit. The integrating circuit, being responsive to the reference signal, generates a comparison signal depending upon a variable gain input. The amplifying circuit responsive to the comparison signal compares the comparison signal to the input signal for generating a digital output signal. A processing circuit of the paging receiver generates a first control signal for modifying the variable bias current input and a second output signal for modifying the variable gain input. Additionally, the processing circuit generates a third control signal being applied to the integrating circuit for effecting a storage of the comparison signal in the integrating circuit.

31 Claims, 6 Drawing Sheets

DIGITAL INTEGRATOR CIRCUIT

DATA LIMITER HAVING CURRENT CONTROLLED RESPONSE TIME

This is a continuation of application Ser. No. 07/000,277, filed 01/02/87 now abandoned.

BACKGROUND OF THE INVENTION

1. Field of the Invention

The present invention relates to communication receivers and more particularly to a data limiter circuit having a variable time constant for converting an analog signal to a digital signal.

2. Background of the Invention

Communications systems in general and paging systems in particular using selective call signalling have attained widespread use for calling a selected paging system receiver by transmitting information from a base station transmitter to the paging receiver. Modern paging receivers have achieved multifunction capability through the use of microprocessors which allow the paging receiver to respond to information having various combinations of tone, tone and voice, or data messages. This information is transmitted using any number of paging coding schemes and message formats.

A block diagram of a prior art receiving system suitable for use in a synchronous paging system is illustrated in FIG. 1. The receiver comprises an antenna 10 which receives an RF signal and transmits it to a receiver 12 where the RF signal is amplified and converted into a first intermediate frequency (I.F.) signal by an RF amplifier and first mixer, respectively. This I.F. signal is preferably directed to the receiver's back-end where a first I.F. signal is converted to a second I.F. signal, in a dual conversion receiver, amplified, limited, demodulated, and filtered. The voltage level of the output signal at output 14 represents coded binary data or digital data. The output 14 of the receiver 12 is capacitively coupled to the input 15 of a data limiter 16 by way of a coupling capacitor 18 and bias resistor 17 connected between the differential inputs of the data limiter 16. The output 13 of the data limiter 16 is directed to a data processor 20 for further desired processing.

The receiver system also includes one or more switches (normally transistors) connected between the various components of the receiver system and the power supply (B+). A switch 22 is periodically turned on and off under control of processor 20 by a battery saver routine 24 to provide a battery saving feature, which is a technique well known to those skilled in the art. A switch 26 (such as a transistor) is periodically closed to precharge the coupling capacitor 18, preferably by placing a resistor 27 in parallel with the limiter bias resistor 17 and input impedance, thereby reducing the overall RC time constant. Switch 26 is normally closed simultaneously with switch 22, but normally remains closed for a shorter time than switch 22 to provide this precharging.

Normally, in situations where it is necessary to pass digital data from the receiver 12 to the data limiter 16, capacitor 18 will be a relatively large value in order to pass low frequency information and digital signals. Thus, a long time may be required to charge the capacitor 18, especially when it is connected to a high impedance such as the limiter bias resistor 17 for the data limiter 16. A long charge time necessitates the receiver "on" time being increased correspondingly to insure that capacitor 18 is charged to its correct bias point and that valid data is delivered to the data processor during the data decoding interval. The battery saver feature is clearly degraded by the extended receiver on time since this consumes more battery energy than is desirable. Switch 26 is used to alleviate this situation by providing a momentary low impedance charge path in parallel with the data limiter bias resistor 17 immediately upon receipt of power from the battery saver 24, that is, when the switch 22 is closed. This allows capacitor 18 to more rapidly charge to the bias voltage, depending upon the average value of the incoming data. If the incoming data can be depended upon to have no long strings of 1's or 0's, the charging of capacitor 18 will closely approximate the desired bias voltage. Data decoding of the received bit stream can begin more rapidly and continue until the battery voltage B+ is again removed by switch 22, thereby enhancing the battery saving feature.

However, several problems exist in using a coupling capacitor 18. Referring briefly to FIG. 2, there is shown, along with the battery saver strobe signal A, an input signal H, a threshold voltage G, and an output signal E of the prior art data limiter 16. The input signal H includes digital data modulated on the waveform. When signal H passes through threshold signal G (time t2), data is detected and decoded as is illustrated in signal E. Note that even with precharging, data before time t2 is lost. Under ideal conditions (an alternating 1–0 data pattern), the average voltage level at the output of the receiver will be at the desired carrier reference voltage, that is, the voltage level which corresponds to an undeviated RF signal. During the precharge interval, capacitor 18 will charge to a bias voltage which is consistent with this carrier reference voltage and proper data decoding will occur. If a long string of 1's or 0's is received immediately before the opening of switch 26, the average DC voltage of the receiver output 14 will be offset from the desired reference. The average DC voltage is increased if a large number of 1's are received or decreased if a large number of 0's are received.

Thus, relatively substantial DC voltage offsets from the correct bias voltage across capacitor 18 may still occur if this technique is used in an asynchronous system with unpredictable data patterns. This may result in erroneous outputs from the data limiter, long response time (the delay required between receipt of a signal and occurrence of valid data at the limiter output), and may ultimately result in the end user receiving no message or an erroneous message which differs from the originally transmitted message.

SUMMARY OF THE INVENTION

The present invention has been developed for the purpose of alleviating the above mentioned problems of the prior art. Accordingly, the invention has as one of its objects an apparatus and method for adjusting and controlling the time response of a data limiter in a communication receiver It is another object of the present invention to provide a data limiter having a controllable variable time constant depending upon a bias current input and a gain control input.

It is another object of the present invention to provide a paging receiver having a data limiter being responsive to a processing means for varying the time constant of a data limiter.

It is another object of the present invention to provide a communication receiver having a data limiter being responsive to a processing means for storing a comparison signal, the comparison signal effecting a conversion of an analog input signal to a digital output signal.

In general, a communication receiver for receiving coded information includes a receiving means, a data limiter, and a processing means. The receiving means receives the coded information including analog signals representative of digital data messages. The data limiter converts the analog signals to corresponding digital output signals to be applied to the processing means. The processing means receives and processes the digital data to provide data messages and alerts for the paging receiver's user. The processing means also controls the time constant of the data limiter and the storage of a comparison signal used for converting the analog signals to digital data.

In particular, the data limiter having a variable time constant comprises an amplifying means, an integrating means, and a comparison means. The amplifying means, having a variable bias current input, produces at its output terminal an analog reference signal from the analog input signal received at its input terminal, the analog reference signal being determined on the basis of the bias current input. The integrating means having a variable gain control produces at its output terminal an analog comparison signal from the analog reference signal, the analog comparison signal being determined on the basis of the gain. The comparison means responsive to the analog input signal and the analog comparison signal produces at its output a digital output signal depending on whether the amplitude of the analog input signal is larger or smaller than that of the analog comparison signal. The processing means produces a first, a second, and third control signal. The first control signal being applied to the amplifying means controls the bias current input. The second control signal being applied to the integrating means controls the gain. The third control signal being applied to the integrating means effects a storage of the analog comparison signal.

DETAILED DESCRIPTION OF THE PREFERRED EMBODIMENT

I. General Description

Figure 1:
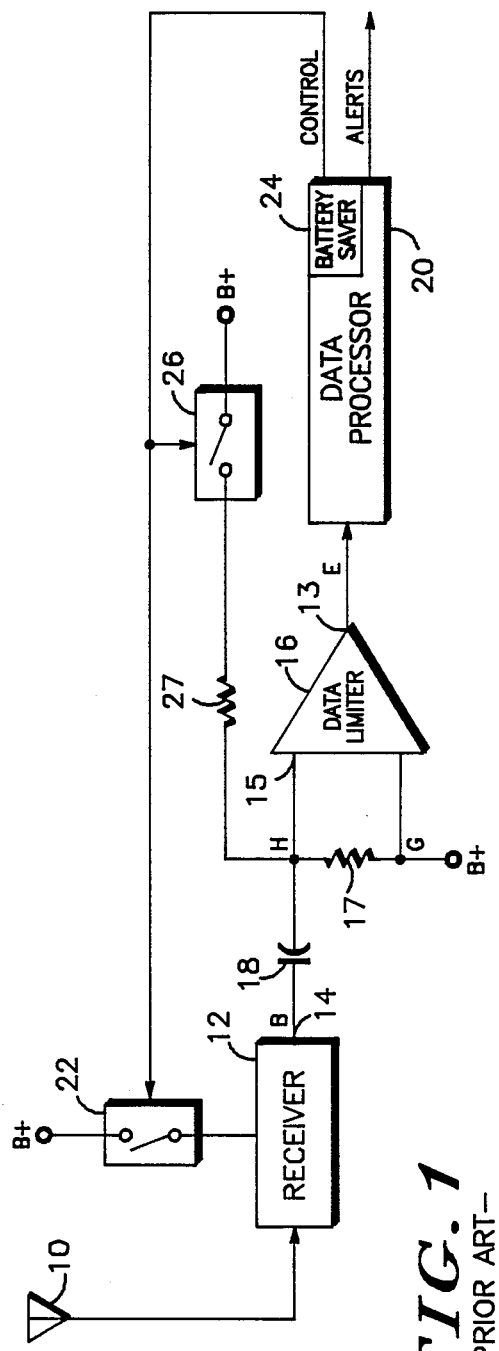
FIG. 1 shows a battery saver receiver system of the prior art using a precharging technique to enhance response time.

Referring to the drawings in general, there is illustrated a method and apparatus for providing a programmable data limiter having a variable current controlled response time. While the present invention is described hereinafter with particular reference to an FM communication receiver and in particular an FM paging receiver, it is to be understood at the outset of the description which follows that it is contemplated that the apparatus and methods, in accordance with the present invention, may be used with other types of communication receivers.

In general, an antenna 10 provides receiver 12 with an input signal which is ultimately converted to a demodulated signal at receiver output 14 and delivered to data limiter 30. The output 14 from receiver 12 is applied to input 29 of the data limiter 30. Data limiter 30 includes at least one transconductance amplifier and integrating means 36. The output 31 from data limiter 30 is applied to an input 21 of a decoding means or processing means such as a data processor 20. Output 37 from data processor 20 is applied as a controlled input 39 to integrating means 36 of data limiter 30.

In one form of the invention, the controlled input of integrating means includes a gain control 58 and a hold control 60. Gain control 58 controls the gain of integrating means 36. Hold control 60 effectively stores the output of integrating means 36.

Another output from data processor 20 is applied to a digital to analog converter 32. The output 33 from digital to analog converter 32 controls bias current input 35 of a transconductance amplifier. Alternatively, digital data lines from processor 20 can replace analog output 33 to control the bias current of the transconductance amplifier. The data limiter circuit 30 can be controlled by output 33 or output 37 to control data limiter's 30 time constant (T1). The output 33 and 37 are programmed by the data processor 20 for tailoring the data limiter's 30 time constant to the particular bit pattern being received. Additionally, input 35 can be set to zero, resulting in the comparison voltage D applied to the non-inverting input of the transconductance amplifier being stored in the integrating means 36. Alternatively, the comparison voltage can be stored by activation of a separate hold control 60.

Figure 2:
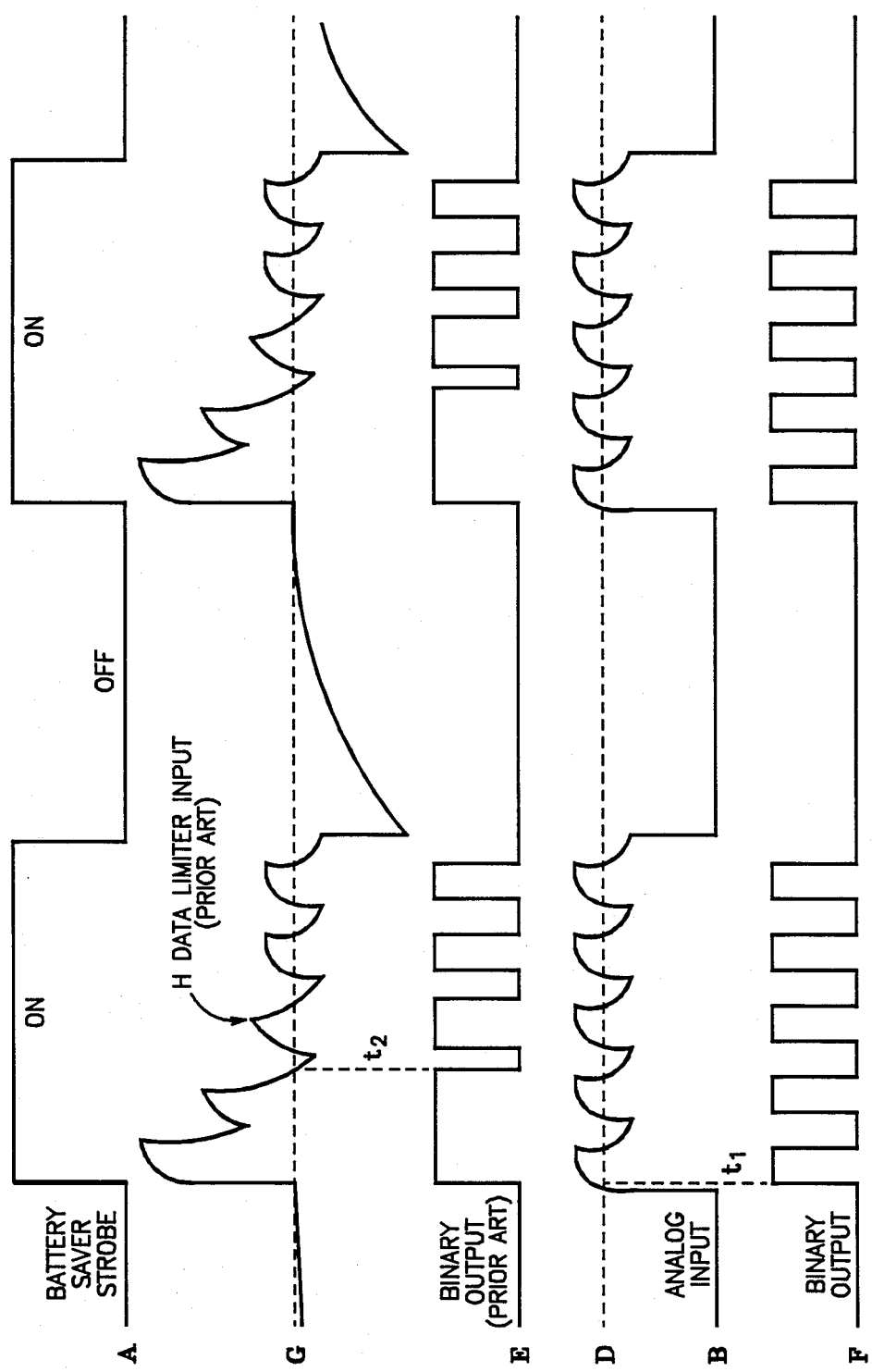
FIG. 2 shows waveforms useful in explaining the operation of the present invention and the prior art.

For clarity, reference is made to FIG. 2 which illustrates waveforms which are helpful in explaining the operation of the data limiter circuit 30. It is to be understood that the waveforms are not exact but representative only. FIG. 2 shows the waveforms for a battery saver implementation of the present invention in which the paging receiver has been powered up and all power up transients have dissipated. Signal A is produced by the battery saver operation of the data processor In order to minimize the drain from the battery, the decoding means or processor is operated in two modes; a high power drain mode when the battery saver strobe signal A is in the high "on" state; and a reduced power drain when the battery saver strobe signal A is in the low "off" state. During the high state, the processor is in a fully operational mode in which it can decode signals in real time. The low portion of the battery saver strobe signal corresponds to a reduced computational ability mode in the data processor in which the data processor merely times the interval to the next transition to the high powered state. The time the data processor is fully operational or in a reduced power state depends upon the particular paging scheme employed by the paging system.

Signal B illustrates data being received by the paging receiver during the "on" time of the battery saving strobe signal. The analog input signal B corresponds to the output 14 of receiver 12 which is applied to input 29 of data limiter 30. As is evident, data is modulated on waveform B in a manner well known in the art. Signal H corresponds to the input voltage of data limiter 16 and signal G represents the data limiter 16 threshold voltage for the prior art shown in FIG. 1. Signal E corresponds to the output of the prior art data limiter. Since signal G decays each time the battery strobe is low and the prior art capacitor must be charged, the data is not detected until a time $t_2$ for each battery saver strobe. One method to compensate for this is to start the battery saver strobe earlier at ($-t_2$). However, this is undesired because it increases the drain on the battery.

Signal D corresponds to the second input or analog comparison signal of data limiter 30 of the present invention. Since analog comparison signal D can be stored during the "off" interval, the data is decoded at an early time $t_1$. As is evident, time $t_1$ is a significant improvement over the prior art decoding of the data at time $t_2$ (signal E). Additionally, since the time constant is programmable in data limiter 30, the time constant can be changed to cause comparison voltage D to track signal B for effectively decoding data during the battery saver strobe "on" interval. Thus, comparing output signal E and signal F which are the digital output signal of the decoded data of signal B, the advantages of the present invention are clearly seen.

Since the time constant of the data limiter of the present invention can be controlled, the data can be decoded earlier during the operation of the paging receiver. The controlling of the time constant for the data limiter also allows an extremely long string of 1's or 0's to be decoded.

The data limiter circuit 30 is adapted to have the time constant of the circuit controlled by an external means, such as data processor 20 also known as a decoding means. The integrating function performed by integrating means 36 can be performed by either analog or digital circuitry. The bias current input 35 or control input 39 can be programmed by decoding means 20 or other means for tailoring the data limiter time constant to the particular bit pattern being received. This optimizes performance by allowing an appropriate time constant to be used for each bit pattern and a resulting fast recovery from DC voltage shifts in the receiver output. In the limiting case, bias current input 35 can be set to zero or alternatively the integrating means 36 can be programmed into a hold mode, resulting in the comparison voltage D being stored in the integrating means 36. This allows the data limiter circuit 30 to operate very efficiently in a battery saver receiver by storing the comparison voltage D during the receiver off interval. A fast response to the transmitted bit pattern is achieved by returning the data limiter time constant to the previous "on" interval time constant at the beginning of the battery saver strobe signal.

Further, at times, it would be advantageous to hold the data limiter comparison voltage D during the time that the transmitted bit pattern is being decoded. This allows an extremely long string of 1's or 0's to be decoded. An example is an alphanumeric display paging receiver where a predetermined time constant is used until the paging receiver address is decoded, and then the comparison voltage D is stored by command from the processor means 20 for allowing a long alphanumeric message to be decoded. This message could be worst case all 1's or all 0's with no degradation due to loss of correct data limiter comparison voltage D. Also, the loss of data due to RF signal fading or channel interference is minimized.

II. Data Limiter

Figure 3:
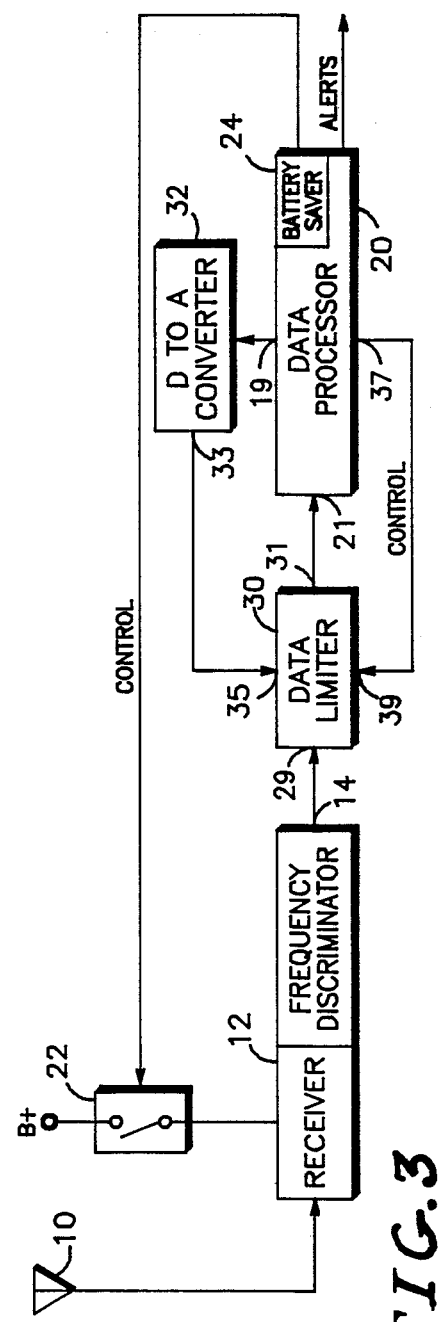
FIG. 3 shows an overall block diagram of the present invention.

Referring to FIG. 3, there is shown a schematic diagram for a paging receiver using the data limiter 30 of the present invention. An antenna 10 provides receiver 12 with an input signal which is ultimately converted to a demodulated signal at receiver output 14 and applied as input signal B to input 29 of data limiter 30. Data limiter 30 is adapted to have a programmable time constant which allows a comparison signal D to maintain an appropriate level for effectively decoding data of input signal B. The output 31 of data limiter 30 is applied to input 21 of data processor 20 for further processing. The receiver system includes one or more switches such as switch 22 connected between the various components of the receiver system and the power supply B+. A switch 22 is periodically turned on and off under control of processor 20 by a battery saver routine 24 to provide a battery saving feature, which is a technique well known to those skilled in the art. Another output from data processor 20 is applied to a digital to analog converter 32. The output 33 from digital to analog converter 32 controls the bias current input 35 of the data limiter 30. The data limiter circuit 30 can be controlled by the output 33 generated by the digital to analog converter 32 for controlling the data limiter 30 time constant (T1). The output 33 is programmed by the data processor for tailoring the data limiter time constant to the particular bit pattern being received. Another output 37 from data processor 20 is applied to an input 39 of data limiter 30. The input 39 includes a gain control and a hold control for the data limiter 30. The gain control provides a further controlling of the data limiter time constant as will be explained with reference to FIG. 4. The hold control allows the data limiter to selectively store the voltage comparison signal D for permitting the data limiter to effectively decode data as will be explained with reference to FIG. 4.

Figure 4:
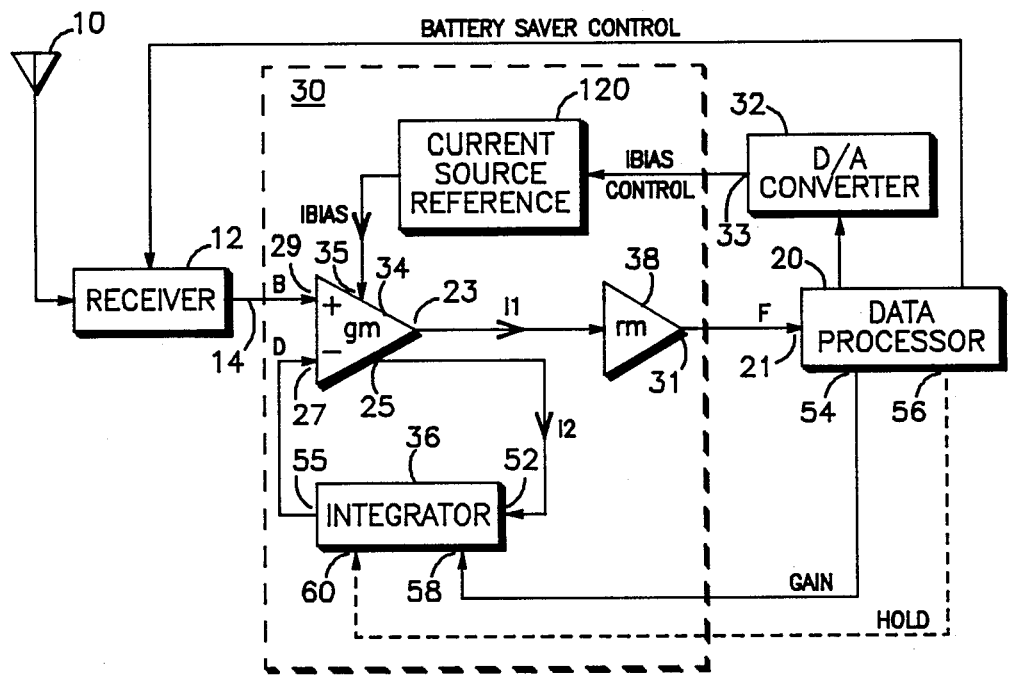
FIG. 4 shows one embodiment of the data limiter of the present invention using only one transconductance amplifier.

In particular, referring to FIG. 4, there is shown a schematic diagram for data limiter 30 of the present invention. Data limiter 30 includes a differential input dual output transconductance amplifier 34 with a transconductance gain (gm) controlled by bias current Ibias applied to input 35. The output 14 of receiver 12 is applied to the non-inverting input 29 of amplifier 34. One current output 23 (I1) of amplifier 34 is applied to a high gain limiting transresistance amplifier 38. Amplifier 38 functions to convert the output current I1 to a limited voltage which is the digital output signal F of data limiter 30. The output of data limiter 30 is applied to an input 21 of data processor 20. Referring back to amplifier 34, the second output 25 (reference signal I2) of amplifier 34 is applied to one input 52 of integrating means 36. Integrating means 36 generates an output voltage (comparison signal D) which is the time integral of the input current I2.

In operation, if a DC bias voltage $V_{bias}$ is applied to the non-inverting input 29 of transconductance amplifier 34, negative feedback from output 25 of amplifier 34 drives comparison voltage D to approach voltage $V_{bias}$. Amplifier 34 output currents I1 and I2 will approach zero and the data limiter output voltage F will be at the threshold of switching.

The time response of the comparison voltage D to a step function input V0 impressed upon the DC bias voltage is given by:
$$D = V_{bias} + V0(1 - e^{-t/T1})$$

The limiter comparison voltage D tracks the input signal B with an exponential time constant T1 given by:

$$T1 = 1/(K0)(K1)(I_{bias}) \qquad \text{equation 1}$$

where
 K0 = gm/$I_{bias}$ = Proportionality constant for amplifier 34
 K1 = integrating means gain The time constant T1 is varied by means of Ibias or the integrating means gain to be large in comparison with the longest string of 1's or 0's in the binary bit pattern to be detected by the data limiter. If a binary bit pattern is applied to the data limiter input B, the limiter comparison voltage D attempts to track the input signal level but never reaches that level (except during transitions) due to the long time constant T1.

For these conditions, the average current I2 into the integrating means 36 approaches zero. Since I1 and I2 are directly proportional, the average current into limiting amplifier 38 must also approach zero. Therefore, the data limiter circuit 30 input comparison voltage D is forced to a level which results in limiting about the average DC value of the incoming signal B. The limited output signal F appears at the output of amplifier 38. At any time, the comparison voltage D can be held and stored in the integrating means 36 by setting bias current Ibias to zero or by programming the integrating means 36 to a hold mode. The digital to analog converter 32 converts a digital output of data processor 20 to the bias control signal which controls transconductance amplifier 34 through a current source reference 120 in a manner well known in the art. In the simplest application, the digital to analog converter 32 can be a resistor connected to a digital voltage output of the data processor 20.

Data processor 20 includes control lines 37 having a gain control output 54 and a hold control output 56. The gain control output 54 is applied to input 58 of integrating means 36 to control the gain of integrating means 36. The hold control signal 56 is applied to another input 60 of integrating means 36 for effecting a storage of the comparison voltage D from output 55 which is applied to the inverting input 27 of amplifier 34.

Since data processor 20 controls the integrating means gain and the Ibias of transconductance amplifier 34, the data processor can effectively control the time constant of the data limiter 30 by varying the bias current Ibias or the integrating means gain. The hold control allows data processor 20 to effectively hold a comparison voltage D on input 27 of amplifier 34. Thus, data processor 20 programmably controls the time constant and the storing of the comparison voltage D of data limiter 30.

Figure 5:
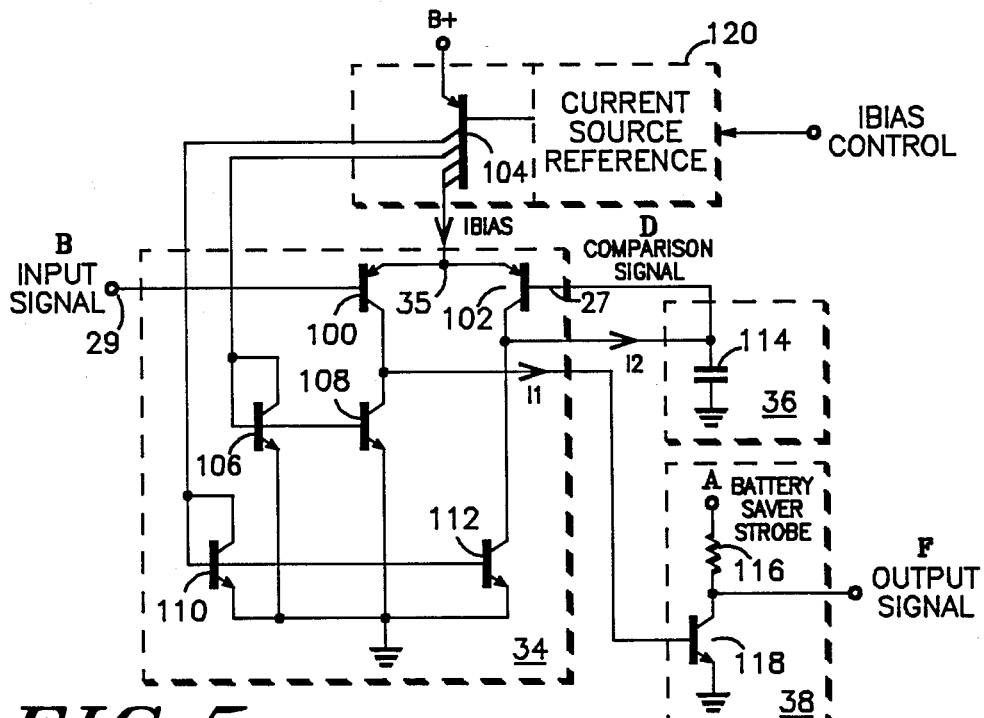
FIG. 5 shows a more detailed schematic of the diagram in FIG. 4.

Turning now to FIG. 5, a more detailed representation of FIG. 4 is shown using integrated circuit design techniques. The voltage input B connected to input 29 is applied to the base of PNP transistor 100. The emitter of transistor 100 is connected to the emitter of PNP transistor 102, forming a differential amplifier configuration of amplifier 34. The bias current Ibias for amplifier 34 is connected to the emitters of transistor 100 and 102. A PNP transistor 104, having four collectors, has two of the collectors coupled to the emitters of transistors 100 and 102 for supplying the bias current. The emitter of transistor 104 is connected to B+, and the base is connected to a current source reference 120 which is connected to an output of the digital to analog converter 32. Referring to transistor 104, the remaining two collectors are connected to the bases of NPN transistors 106, 108, 110, and 112. The connection of transistor 104 forms a controllable current supply for the differential amplifier configuration of transistors 100 and 102 and the D biased circuits formed by transistors 106 and 108 and transistors 110 and 112.

One-fourth of the current from transistor 104 is applied to the bases of 106 and 108. Transistor 106 has its collector tied to its base and the emitter tied to ground. The collector of transistor 108 is connected to the collector of transistor 100 and further connected to the base of transistor 118. The emitter of transistor 108 is connected to ground. In operation, transistors 106 and 108 form a current mirror configuration providing a DC bias for transistor 100.

Referring back to transistor 104, one-fourth of the current from the collectors of 104 is applied to the bases of transistor 110 and 112. The collector of 110 is tied back to its base while the emitter is connected to ground. For transistor 112, the collector is connected to the collector of transistor 102 while the emitter is connected to ground. Transistors 110 and 112 form a current mirror which provides a DC bias for transistor 102.

The collectors of transistors 102 and 112 are further connected to a capacitor 114. The other end of capacitor 114 is connected to ground. The integrator in its simplest form includes the capacitor 114. The collectors of transistor 102 and 112 are further connected to the base of transistor 102. It is important to note that the base of transistor 102 is the inverting input 27 (comparison signal D) of amplifier 34.

Referring to transistor 118, the collector of 118 is connected in series with a resistor 116 to the battery saver strobe, also known as signal A. The emitter of transistor 118 is connected to ground. The output of the data limiter 30 is connected to the collector of 118. When transistor 118 is turned off, the output F is pulled toward the battery saver strobe voltage by resistor 116. When the transistor is turned on, the output is coupled to ground, thereby pulling the output low. Transistor 118 is controlled by current I1 generated between the collectors of transistor 100 and 108.

In operation, with voltage B greater than D, more current will flow through transistor 102. The current flowing through 102 will be larger than the collector current of 112 and will charge capacitor 114. Since the collector of 102 is connected to its base, the voltage level D will build slowly to the level of voltage B. While the input voltage B is greater than the comparison voltage D, less current will flow through transistor 100 than is flowing through the mirror current formed by transistors 106 and 108. This causes the voltage at the base of transistor 118 to drop, turning the transistor 118 off. When transistor 118 is turned off, the voltage output F is pulled to the battery saver strobe level.

Eventually, voltage D will approach voltage B and the currents I1 and I2 will approach zero since the circuit will be in balance. When voltage B is less than voltage D, more current will flow through transistor 100 than that that can be handled by transistor 108. Thus, current flows to the base of transistor 118, causing transistor 118 to turn on. When transistor 118 turns on, this causes voltage F to be pulled low since it is now connected to ground.

To repeat, the transconductance amplifier includes the transistors 100-102, 106-112, transistors 100 and 102 forming a differential amplifier with transistors 106-112 providing biasing currents. In one form of the invention, the integrating means 36 comprises capacitor 114 for performing the integrating function. The transresistance amplifier 38 includes transistor 118 and resistor 116. The voltage input B is applied to the base of transistor 100 and the digital output voltage F is taken from the collector of 118. The current source reference 120 controls the currents sourced by transistor 104 and the time constant of the data limiter. The time constant T1 of the data limiter is given by:

$$T1 = 4(K)(T)(C)/(q)(I_{bias}) \qquad \text{equation 2}$$

where
- C = Capacitance of capacitor 114
- K = Boltzmann's constant
- T = Temperature in degrees Kelvin
- q = Electron charge The dependence of the time constant T1 on temperature can be eliminated if a bandgap current reference is used. A single analog control input to the current source reference allows complete control of the data limiter time constant as well as the ability to store (Ibias=0) the comparison voltage D on capacitor 114 during the battery saver off interval.

The sensitivity of the data limiter circuit 30 to variations in PNP transistor beta can be reduced by taking output current I1 from transistor 102 instead of 100. This is accomplished by splitting the collector of transistor 102 into two collectors and using the added collector to drive the base of transistor 118. The collector of transistor 100 is then attached to ground and the collector of 108 is connected to the base of transistor 118. For a given current Ibias, the bias circuits being sinked by transistors 108 and 112 would require reduction by 50 percent when this change is made. The data limiter time constant would then be increased by a factor of 2.

III. Integrating Means

Figure 6:
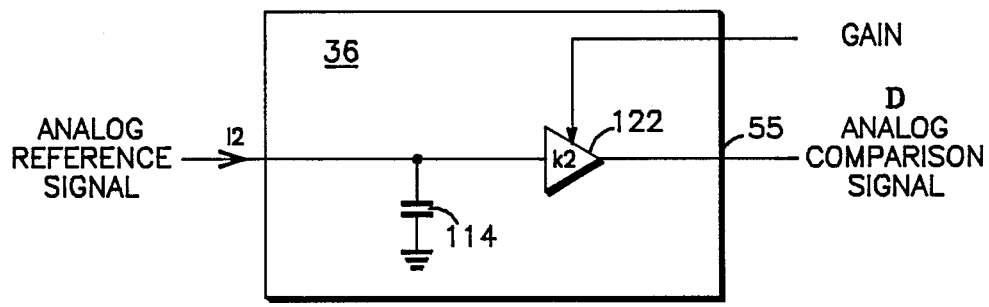
FIG. 6 shows a more detailed schematic of an analog circuit embodiment of the integrating means of the present invention.

Referring to FIG. 6, the analog integrator circuit shown in FIG. 6 includes capacitor 114 for integrating the input current I2 and generating the comparison voltage D. Alternatively, a buffer amplifier 122 having a fixed or variable gain (K2) may be connected between capacitor 114 and output 55. The buffer amplifier 122 improves performance of the circuit by minimizing loading on capacitor 114. The variable gain buffer amplifier 122 allows the gain of integrating means 36 to be controlled by data processor 20. In this case, the integrating means transfer function is given by:

$$D = K1 \int_0^t I2\, dt \qquad \text{equation 3}$$

where
- K1 = K2/C = Integrator gain
- C = Integrator capacitance
- K2 = Voltage gain of buffer amplifier 122

As is evident, the comparison signal D is now dependent on the gain of buffer amplifier 122 and the capacitance C of capacitor 144.

Figure 7:
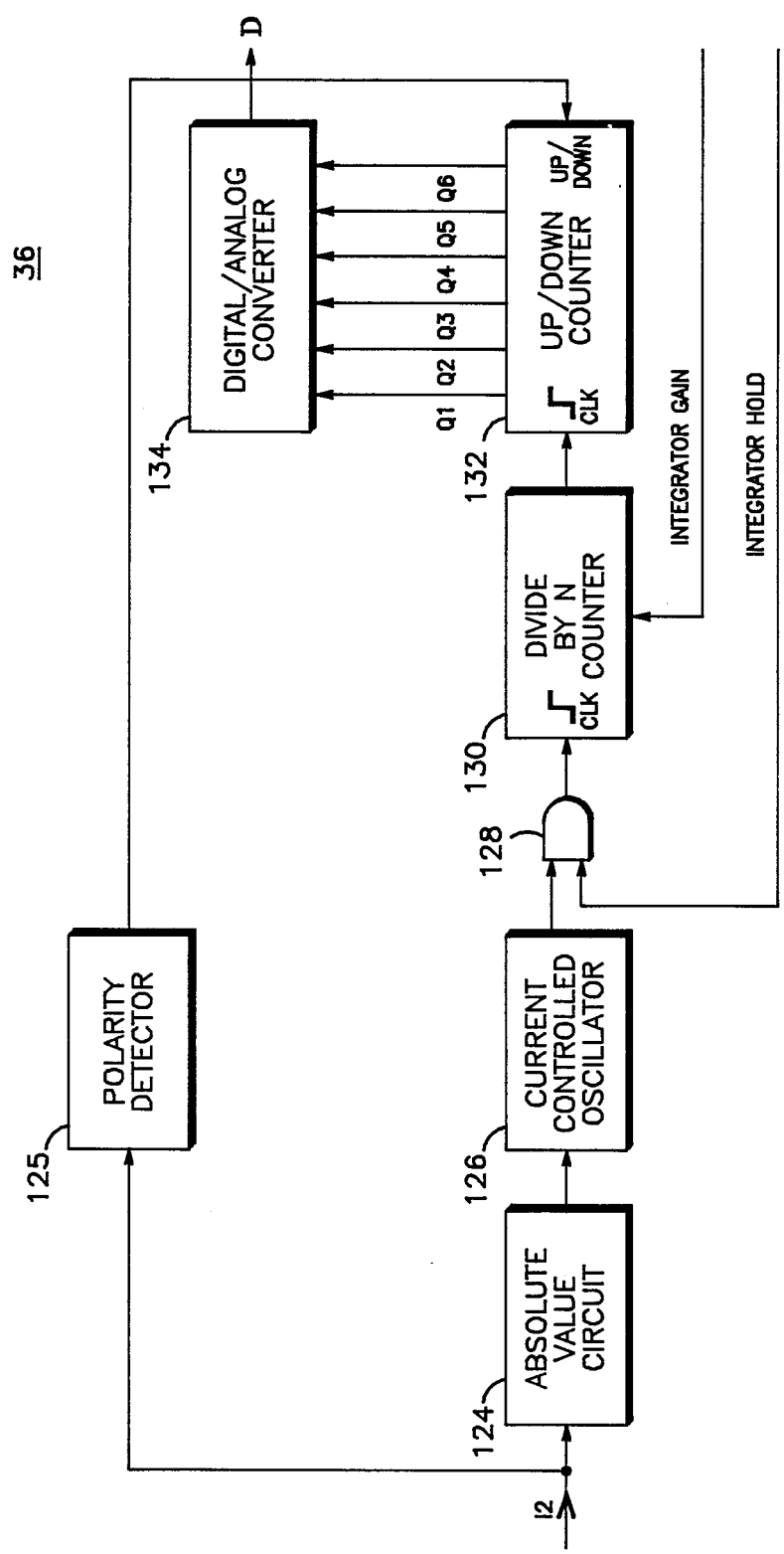
FIG. 7 shows a more detailed schematic of a digital circuit embodiment of the integrating means of the present invention.

Turning now to FIG. 7, another embodiment of the integrating means 36 is shown. The digital integrating circuit of FIG. 7 includes an absolute value circuit 124 connected to the output 25 of amplifier 34. The absolute value circuit 124 is connected to a current controlled oscillator 126. The absolute value circuit 124 is used to transform a positive or negative input current I2 into a positive current for driving the current controlled oscillator 126. Alternatively, the input current I2 could be converted to a voltage before being applying to the absolute value circuit 124. A voltage controlled oscillator would then be used. The oscillator 126 generates an output frequency which is directly proportional to the input current I2. To optimize performance, the oscillator digital output signal is latched at the last level whenever the input current is zero or near zero. The output from the oscillator 126 is applied to one input of an AND gate 128. The other input of the AND gate 128 is tied to the hold control signal from the data processor means. The output from AND gate 128 is applied to an input of a programmable divide by N counter 130. The AND gate 128 causes the integrator output voltage (comparison voltage D) to be stored whenever the hold signal is activated from the data processor. The programmable counter 130 controls the integrator gain with one or more inputs from an external source. The AND gate 128 and programmable counter 130 are optional and not required for the basic operation of the integrating means. The output of the programmable counter 130 drives the up/down counter 132 which in turn drives the digital to analog converter 134. The direction that the up/down counter will count is controlled by the digital signal derived from a polarity detector 125 responsive to the integrator input current I2. For a positive input current I2, the polarity detector 125 causes the counter 132 to count in a direction that results in an increasing digital to analog converter output voltage D. Although FIG. 7 illustrates a 6 bit digital to analog converter, other size converters can be used.

It is to be understood that a digital value for comparison voltage D can be maintained in counter 132 even though power is removed from the other circuitry of integrating means 36. The up/down counter 132 can also be powered down if the binary pattern in the up/down counter 132 is temporarily store elsewhere such as in the data processor.

The approximate analog transfer function for the digital integrator is:

$$V2 = K1 \int_0^t I2\, dt \qquad \text{equation 4}$$

where
- K1 = K3/N = Integrator gain
- N = Division ratio of programmable divide-by-N counter
- K3 = Gain of integrator not including programmable counter Thus, the digital integrator circuit of FIG. 7 shows one method for providing a programmable gain for the integrating means to control the time constant of the data limiter. Thus, the time constant of the data limiter can be easily controlled through programming the data processor 20.

IV. Data Limiter

Figure 8:
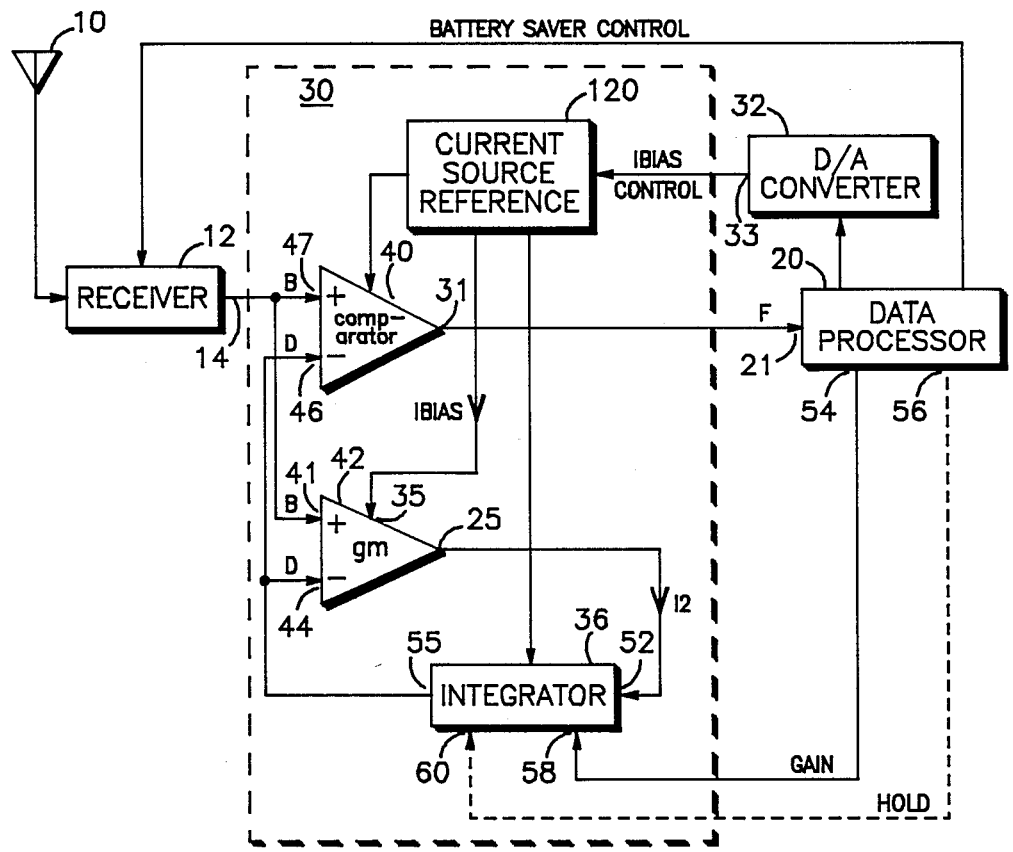
FIG. 8 shows another embodiment of the present invention including a transconductance amplifier and a comparator.

Turning to FIG. 8, a second embodiment of the data limiter circuit is shown. The circuit of FIG. 8 is similar to the data limiter circuit in FIG. 4. The dual output transconductance amplifier 34 and amplifier 38 of FIG. 4 has been replaced by a voltage comparator 40 and a single ended transconductance amplifier 42. The input voltage B is applied simultaneously to the non-inverting input 47 of comparator 40 and the non-inverting input 41 of transconductance amplifier 42. The output from integrating means 36 is connected to the inverting input 44 of transconductance amplifier 42 and the inverting input 46 of comparator 40. The output from comparator 40 is the binary output signal F which is applied to input 21 of data processor 20. Current output 25 (I2) from transconductance amplifier 42 is applied to the input 52 of integrating means 36. The digital to analog converter 32 controls the bias current (Ibias) of transconductance amplifier 42. The circuit in FIG. 8 allows the data limiter control current Ibias to be reduced to zero or near zero without losing the data limiter output signal F. Before in FIG. 4, when the Ibias current was reduced to zero, this eliminated the driving current I1 for the transresistance amplifier 38 with a resultant loss in data limiter output signal F. It is important to note that in FIG. 4, Ibias is turned to zero only when the battery saver strobe signal is turned "off". However, the data limiter circuit of FIG. 8 allows the data limiter control current Ibias to be reduced to zero or near zero without losing the data limiter output signal F.

In operation, the input signal B is compared to voltage comparison signal D at voltage comparator 40. If voltage B is greater than voltage D, the output 31 from comparator 40 is at a high level. If voltage is less than voltage D, the output 31 from comparator 40 is at a low level. To generate voltage comparison signal D, input signal B is applied to the non-inverting input 41 while the output 55 of integrating means 36 is applied to the inverting input 44 of amplifier 42. The output 55 (comparison voltage D) tracks the input signal B with an exponential time constant T1 as described in reference to FIG. 4. The comparison signal D is then fed back to the amplifier 42 and used as a comparison signal in comparator 40.

Figure 9:
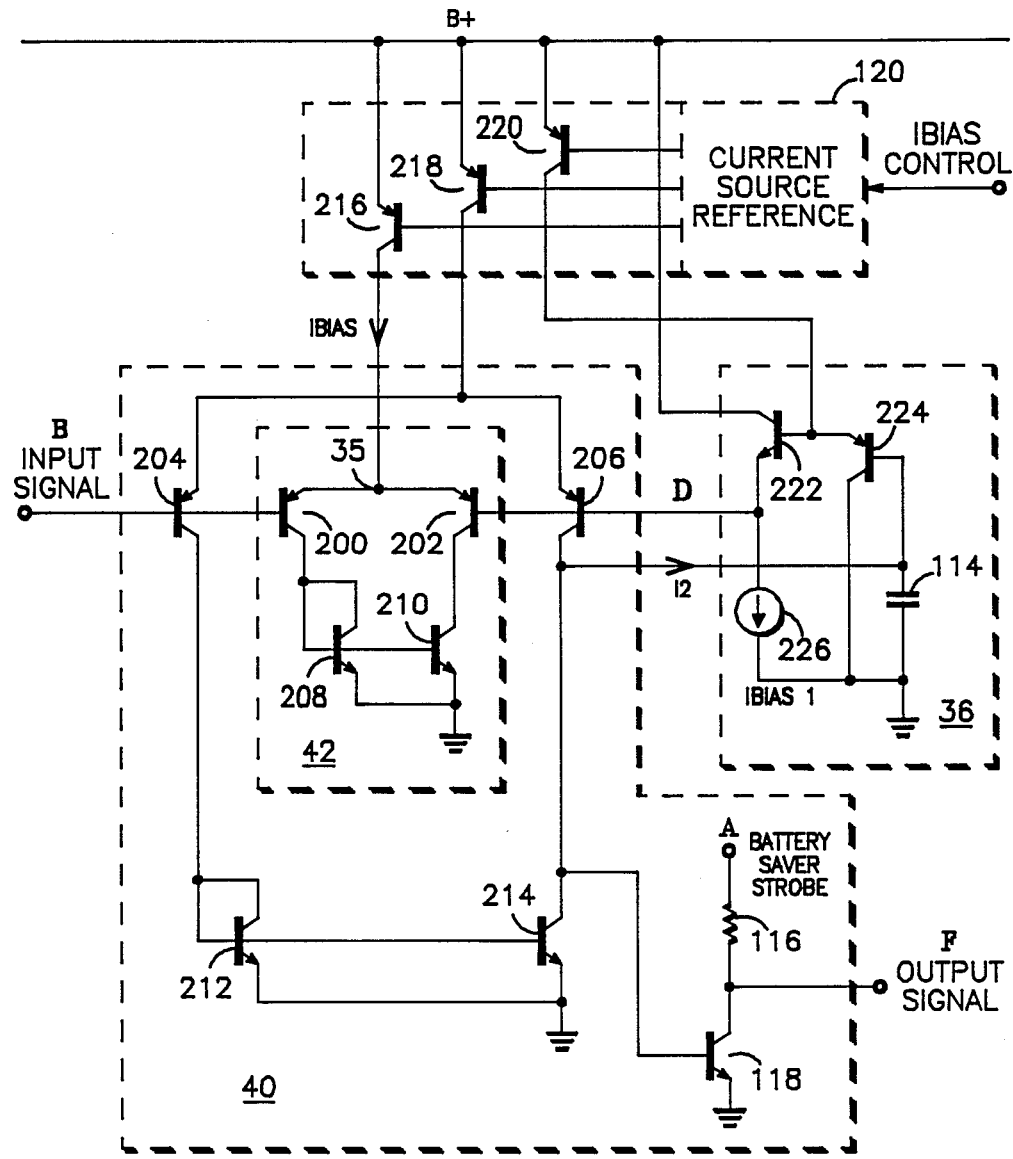
FIG. 9 shows a more detailed schematic of the diagram of FIG. 8.

Referring to FIG. 9, there is shown a detailed schematic diagram of the data limiter as shown in FIG. 8. The phantom lines show the components of the comparator 40, amplifier 42, integrating means 36, and current source reference 120. It is to be understood that the phantom lines showing the components of amplifier 42 are not included in the components for comparator 40. The transconductance amplifier 42 includes PNP transistors 200 and 202 and NPN transistors 208 and 210. The voltage comparator 40 includes PNP transistors 204 and 206 and NPN transistors 118, 212, and 214 in addition to resistor 116. The integrating means for generating comparison voltage D includes capacitor 114, NPN transistor 222, and PNP transistor 224. The voltage input B is applied to the base of transistors 204 and 200. The comparison voltage D is applied to the base of transistors 202 and 206. The output from the data limiter is taken from the collector of transistor 118. The current source reference 120 controls the bias current(Ibias) applied to the transconductance amplifier 42 by way of PNP transistor 216, to the voltage comparator 40 by way of PNP transistor 218, and to the integrator by way of PNP transistor 220. The emitters for transistors 216–220 are connected to B+. The collector for transistor 216 is connected to the emitters of transistors 200 and 202. The collector for transistor 218 is connected to the emitters of transistors 204 and 206. The collector of transistor 220 is connected to the emitter of transistor 224 and the base of 222.

In operation, transistor 216 provides the bias for the transconductance amplifier 42. Transistor 218 provides the bias current for the voltage comparator. Transistor 220 provides bias current for the integrating means 36. The collector of transistor 200 is connected to the base of transistor 208 and transistor 210. The collector of 208 is connected back to the base of 208. The emitter of transistor 208 is connected to ground. The emitter of transistor 210 is connected to ground with the collector of transistor 210 connected to the collector of transistor 202 and the capacitor 114 and the base o transistor 224. The other end of capacitor 114 is connected to ground. In operation, transistors 208 and 210 form a current mirror circuit for the transconductance amplifier 42. The output of the transconductance amplifier 42 is formed at the junctions of the collectors 210 and 202 and is applied to the capacitor 114 and to the base of transistor 224. The collector of transistor 224 is connected to ground and the emitter is connected to the collector of 220 and the base of transistor 222. The collector of transistor 222 is connected to B+ with the emitter connected to the base of transistor 206 and a current source 226. In operation, transistors 222 and 224 form a high input impedance buffer amplifier which minimizes loading on capacitor 114.

The collector of transistor 204 is connected to the bases of transistor 212 and 214, transistor 212 having its collector connected back to its base and its emitter connected to ground. Transistor 214 has its emitter connected to ground and its collector connected to the collector of transistor 206. The collectors of transistors 206 and 214 are connected to the base of transistor 118. The connection of transistor 118 has been previously explained with reference to FIG. 5 and is not repeated here. The output of comparator 40 is the collector of transistor 118. The output of the comparator 40 is voltage output F which is applied to the data processor 20. The operation of the transconductance amplifier and the voltage comparator circuit have been explained with reference to FIG. 8 and will not be repeated here.

It is noted that the circuit of FIG. 9 provides the ability to control the bias currents individually for the voltage comparator 40, the transconductance amplifier 42, and the buffer of integrating means 14. The transistors 216–220 can be switched off during battery saver off interval for minimizing current drain. Transistor 216, providing the bias current for the transconductance amplifier, can be switched off during the battery saver on interval for storing the comparison voltage C while maintaining a valid data limiter output signal F. The current Ibias from transistor 216 controls the data limiter time constant T1 as follows:

$$T1 = (2)(K)(T)(C)/(q)(Ibias) \qquad \text{equation 5}$$

Thus, it is evident by varying the Ibias, the data limiter time constant can be changed.

Thus, it is apparent that in accordance with the present invention, an apparatus and method fully satisfies the objectives, aims, and advantages as set forth above. While the invention has been described in conjunction with specific embodiments, it is evident that many alternatives, modifications, and variations will become apparent to those skilled in the art in light of the foregoing description. Accordingly, it is intended that the present invention embrace all such alternatives, modifications, and variations as fall within the spirit and broad scope of the appended claims.

What is claimed is:

1. A data limiter in a communication receiver, the data limiter having a variable time constant for converting an analog input signal to a digital output signal, said data limiter comprising:
   an amplifying means having a variable bias current input for producing at its output terminal an analog reference signal from said analog input signal received at its input terminal, said analog reference signal being determined on the basis of the bias current input;
   integrating means having a variable gain control input for producing at its output terminal an analog comparison signal from said analog reference signal, said analog comparison signal being determined on the basis of the gain of said integrating means;
   processing means for producing a first control and second control signal, said amplifying means being responsive to said first control signal for modifying the bias current input and said integrating means being responsive to said second control signal for modifying the gain, whereby the analog reference signal is modified by the bias current input and gain input; and
   a comparison means for producing at its output a digital output signal, depending on the difference between the analog comparison signal and the analog input signal.

2. The data limiter of claim 1 wherein the comparison means produces a digital output signal, depending on whether the amplitude of said analog input signal is larger or smaller than that of said analog comparison signal.

3. The data limiter of claim 2 wherein the integrating means includes a storing means for storing the analog comparison signal.

4. The data limiter of claim 3 wherein the processing means generates a third control signal being applied to said integrating means for controlling the storing of the analog comparison signal.

5. The data limiter of claim 3 wherein the storing means comprises a capacitor.

6. The data limiter of claim 3 wherein the integrating means comprises a digital integrating circuit.

7. The data limiter of claim 6 wherein the digital integrating circuit comprises:
   an absolute value circuit responsive to the analog reference signal for producing an absolute value of the analog reference signal;
   an oscillator responsive to the absolute analog reference signal for converting the absolute analog reference signal to a corresponding frequency;
   a counter being responsive to the output of said oscillator for generating a digital count; and
   a digital to analog converter for converting the digital count of said counter to the analog comparison signal.

8. The data limiter of claim 7 wherein the counter comprises:
   a gating means responsive to the output of said oscillator and said third control signal for selectively applying the output from said oscillator;
   a programmable counter responsive to the output of said gating means for generating a clock pulse, said programmable counter further responsive to said second control signal for selectively applying said clock pulse; and
   a second counter responsive to said clock pulses for generating a digital count depending on a polarity of said analog reference signal.

9. The data limiter of claim 5 wherein the analog comparison signal is stored in response to the termination of power to the receiver.

10. A data limiter in a communication receiver, the data limiter converting an analog input signal to a digital output signal, said data limiter comprising:
    amplifying means, responsive to the analog input signal, for generating an output reference signal determined on the basis of a bias current;
    integrating means, responsive to said output reference signal, for producing a comparison signal determined on the basis of a gain;
    comparison means, responsive to said comparison signal for producing a digital output depending on the difference between the analog input signal and said comparison output signal; and
    processing means for producing a first control signal, wherein said amplifying means having a variable bias current is responsive to said first control signal for modifying the bias current.

11. The data limiter of claim 10 wherein said processing means generates a second control signal, said integrating means further having a variable gain and being responsive to said second control signal for modifying the gain.

12. The data limiter of claim 10 wherein the integrating means includes a storage means for storing the comparison signal, and further wherein the processing means produces a third control signal, said integrating means being responsive to said third control signal for effecting the storage of said comparison signal by said storage means.

13. The data limiter of claim 12 the storage means comprises a capacitor.

14. The data limiter of claim 12 wherein the integrating means includes:
    an absolute value means responsive to said reference signal for producing an absolute value of the reference signal;
    a frequency generating means responsive to the absolute value of the reference signal for converting the absolute reference signal to a corresponding frequency;
    a digital counting means being responsive to the frequency of said frequency generating means for generating a digital count; and
    a digital converting means responsive to said digital count for converting the digital count to the analog comparison signal.

15. The data limiter of claim 14 wherein the digital counting means includes:

a gating means responsive to the output of said frequency generating means and said third control signal for selectively applying the output from said frequency generating means; and a programmable counting means being responsive from the output of said gating means for generating clock pulses; and a second digital counting means responsive to said clock pulses for generating a digital count depending on a polarity of said reference signal.

16. The data limiter of claim 15 further including a polarity detecting means responsive to the polarity of the reference signal for effecting a counting in the second digital counting means for directing the value of the comparison signal towards the value of the input signal.

17. The data limiter of claim 10 wherein the integrating means includes a storage means for storing the comparison signal, and further wherein the processing means generates a fourth control signal to control power to the receiver, the fourth control signal being substantially synchronized with the first control signal such that when power is terminated to the receiver, said processing means causes the comparison signal to be stored.

18. A method for converting an analog input signal to a digital output signal in a data limiter of a paging receiver, the paging receiver having a receiving means, a storage means, and a processing means, and wherein the storage means is responsive to the processing means, said method including the steps of:
(a) receiving coded information, the coded information including analog signals representative of digital data messages;
(b) generating a comparison signal depending on the analog signal and a time constant of the data limiter;
(c) comparing the comparison signal to the analog signal;
(d) converting the analog signal to a digital signal on the basis of the difference between the analog signal and comparison signal; and
(e) storing the comparison signal in the storage means under control of the processing means.

19. The method of claim 18 wherein the data limiter includes an amplifier and an integrating means responsive to the amplifier, wherein the step (b) of generating further includes the steps of:
(f) amplifying the analog signal on the basis of a bias current input to produce a reference signal in response thereof; and
(g) integrating the reference signal to produce the comparison signal representative thereof.

20. The method of claim 19 further including the steps of:
(h) generating a first control signal at the processing means for controlling the bias current input; and
(i) modifying the first control signal for adjusting the bias current of the amplifying means to vary the time constant of the data limiter.

21. The method of claim 19 wherein the step (g) of integrating further includes the steps of:
(j) integrating the reference signal on the basis of a gain to produce the comparison signal;
(k) generating a second control signal at the processing means for controlling the gain of the integrating means; and (l) modifying the second control signal for adjusting the gain of the integrating means to vary the time constant of the data limiter.

22. The method of claim 18 wherein the receiving means operates in response to a battery saver strobe signal generated by the processing means and wherein step (e) of storing further includes the steps of:
(m) generating a third control signal at the processing means for controlling the storing of the comparison signal; and
(n) generating the battery saver strobe signal at the processing means substantially simultaneously with the generation of the third control signal for effecting storage of the comparison signal when the battery saver strobe signal terminates power to the receiving means.

23. The data limiter of claim 17 wherein the bias current to said amplifier means is reduced to substantially zero for effecting storage of the comparison signal when power is terminated to the receiver.

24. The data limiter of claim 17 wherein the processing means produces a third control signal, said integrating means being responsive to said third control signal for effecting the storage of said comparison signal when power is terminated to the receiver.

25. The method of claim 18 wherein step (e) of storing further comprises storing the comparison signal on the basis of the received coded information.

26. A data limiter in a communication receiver, the data limiter converting an analog input signal to a digital output signal, said data limiter comprising:
amplifying means, responsive to the analog input signal, for generating an output reference signal determined on the basis of a bias current;
integrating means, responsive to said output reference signal, for producing a comparison signal determined on the basis of a gain, said integrating means further including a storage means for storing said comparison signal;
comparison means, responsive to said comparison signal for producing a digital output depending on the difference between the analog input signal and said comparison output signal; and
processing means for producing a control signal, wherein said integrating means being responsive to said control signal stores said comparison signal in said storage means.

27. The data limiter of claim 25 wherein said processing means generates battery saver strobe signal to terminate power to the receiver such that when power is terminated to the receiver, said processing means generates said control signal for effecting storage of said comparison signal in said storage means.

28. A data limiter in a communication receiver, the data limiter converting an analog input signal to a digital output signal, said data limiter comprising:
amplifying means, responsive to the analog input signal, for generating an output reference signal;
integrating means, responsive to said output reference signal, for producing a comparison signal determined on the basis of a gain, said integrating means further including a storage means for storing said comparison signal;
comparison means, responsive to said comparison signal for producing a digital output depending on the difference between the analog input signal and said comparison output signal; and processing means for producing a control signal, wherein said integrating means being responsive to said control signal stores said comparison signal in said storage means.

29. The data limiter of claim 28 wherein said processing means generates a batter saver strobe signal to terminate power to the receiver such that when power is terminated to the receiver, said processing means generates said control signal for effecting storage of said comparison signal in said storage means.

30. The data limiter of claim 28 wherein the integrating means comprises a digital integrating circuit.

31. The data limiter of claim 30 wherein the digital integrating circuit includes a counter being responsive to said control signal to store a count representative of the comparison signal.

* * * * *

UNITED STATES PATENT AND TRADEMARK OFFICE
CERTIFICATE OF CORRECTION

PATENT NO.   :   4,866,261
DATED        :   September 12, 1989
INVENTOR(S)  :   Gary L. Pace It is certified that error appears in the above-identified patent and that said Letters Patent is hereby corrected as shown below:

FIG. 9, the base of transistor 224 should be connected to the collector of transistor 202, not transistor 206.

Col. 2, line 60, after "receiver", insert --.--.

Col. 8, line 16, after "D", insert --C--.

Col. 9, line 46, delete "circuits" and insert --currents--.

Col. 12, line 21, after "base", delete "o" and insert --of--.

Col. 12, line 55, delete "14" and insert --36--.

Signed and Sealed this

Tenth Day of September, 1991

Attest:

HARRY F. MANBECK, JR.

*Attesting Officer*              *Commissioner of Patents and Trademarks*